United States Patent
Sun et al.

(10) Patent No.: US 7,829,989 B2
(45) Date of Patent: *Nov. 9, 2010

(54) VERTICAL PACKAGED IC DEVICE MODULES WITH INTERCONNECTED 3D LAMINATES DIRECTLY CONTACTS WAFER BACKSIDE

(75) Inventors: Ming Sun, Sunnyvale, CA (US); Yueh Se Ho, Sunnyvale, CA (US)

(73) Assignee: Alpha & Omega Semiconductor, Ltd., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/318,300

(22) Filed: Dec. 22, 2005

(65) Prior Publication Data

US 2007/0085187 A1    Apr. 19, 2007

Related U.S. Application Data

(63) Continuation-in-part of application No. 11/220,759, filed on Sep. 7, 2005.

(51) Int. Cl.
  *H01L 23/02* (2006.01)
(52) U.S. Cl. .................. 257/686; 257/737; 257/738; 257/687; 257/688; 257/689; 257/690; 257/790; 257/795; 257/E23.001; 257/E23.194; 257/E23.021; 257/E23.069; 257/E23.508
(58) Field of Classification Search .............. 257/678, 257/684, 686, 690, 707, 713, 734, 737, 738, 257/748, 777, 778, 780, 782, 783, E23.021, 257/E23.069, E21.508, E23.001, E23.194
See application file for complete search history.

(56) References Cited

U.S. PATENT DOCUMENTS

| | | | |
|---|---|---|---|
| 4,474,632 A | 10/1984 | Spees | |
| 5,222,014 A | 6/1993 | Lin | |
| 5,270,261 A | 12/1993 | Bertin et al. | |
| 5,367,189 A | 11/1994 | Nakamura | |
| 5,705,858 A | 1/1998 | Tsukamoto | |
| 5,715,144 A | 2/1998 | Ameen et al. | |
| 5,793,105 A | 8/1998 | Pace | |
| 5,872,025 A | 2/1999 | Cronin et al. | |
| 5,872,374 A | 2/1999 | Tang et al. | |

(Continued)

*Primary Examiner*—Wael M Fahmy
*Assistant Examiner*—Marc Armand
(74) *Attorney, Agent, or Firm*—Bo-In Lin

(57) ABSTRACT

An electronic package for containing at least a top packaging module vertically stacked on a bottom packaging module. Each of the packaging modules includes a semiconductor chip packaged and connected by via connectors and connectors disposed on a laminated board fabricated with a standard printed-circuit board process wherein the top and bottom packaging module further configured as a surface mountable modules for conveniently stacking and mounting to prearranged electrical contacts without using a leadframe. At least one of the top and bottom packaging modules is a multi-chip module (MCM) containing at least two semiconductor chips. At least one of the top and bottom packaging modules includes a ball grid array (BGA) for surface mounting onto the prearranged electrical contacts. At least one of the top and bottom packaging modules includes a plurality of solder bumps on one of the semiconductor chips for surface mounting onto the prearranged electrical contacts. The laminated board of the bottom packaging modules further has a thermal expansion coefficient substantially the same as a printed circuit board (PCB) whereby a surface mount onto the PCB is less impacted by a temperature change.

23 Claims, 10 Drawing Sheets

U.S. PATENT DOCUMENTS

| | | |
|---|---|---|
| 5,952,725 A | 9/1999 | Ball |
| 5,994,166 A | 11/1999 | Akram et al. |
| 6,084,294 A | 7/2000 | Tomita |
| 6,137,164 A * | 10/2000 | Yew et al. .................... 257/686 |
| 6,265,772 B1 * | 7/2001 | Yoshida ....................... 257/712 |
| 6,344,401 B1 | 2/2002 | Lam |
| 6,583,513 B1 | 6/2003 | Utagikar et al. |
| 6,611,052 B2 | 8/2003 | Poo et al. |
| 6,614,104 B2 | 9/2003 | Farnworth et al. |
| 6,777,787 B2 * | 8/2004 | Shibata ....................... 257/666 |
| 6,798,057 B2 | 9/2004 | Bolkin et al. |
| 6,815,254 B2 * | 11/2004 | Mistry et al. ................. 438/108 |
| 6,856,025 B2 | 2/2005 | Pogge et al. |
| 6,902,953 B2 | 6/2005 | Haba |
| 7,205,647 B2 * | 4/2007 | Karnezos .................... 257/686 |
| 2001/0028114 A1 * | 10/2001 | Hosomi ....................... 257/778 |
| 2004/0178508 A1 * | 9/2004 | Nishimura et al. ........... 257/778 |
| 2004/0251529 A1 * | 12/2004 | Lee et al. .................... 257/686 |
| 2005/0001301 A1 | 1/2005 | Aoyagi |
| 2005/0087854 A1 * | 4/2005 | Choi et al. ................... 257/686 |
| 2005/0184377 A1 * | 8/2005 | Takeuchi et al. ............ 257/686 |
| 2006/0001179 A1 * | 1/2006 | Fukase et al. ............... 257/778 |

* cited by examiner

A-A

A-A

B-B

A-A

B-B

VERTICAL PACKAGED IC DEVICE MODULES WITH INTERCONNECTED 3D LAMINATES DIRECTLY CONTACTS WAFER BACKSIDE

This is a Continuous-In-Part (CIP) Application of a previously filed co-pending Application with Ser. No. 11/220,759 filed on Sep. 7, 2005 by identical common inventors of this Application. Applications Ser. No. 11/220,759 is hereby incorporated by reference in this Patent Application.

BACKGROUND OF THE INVENTION

1. Field of the Invention

The invention relates generally to the process and configuration for packaging integrated circuits such as power MOSFETs and other types of integrated circuits, such as power IC. More particularly, this invention relates to a novel and improved method and configuration for simplifying and streamlining the MOSFET and IC device package processes as highly integrated module to achieve lower production cost, higher packaging throughput and packages with improved reliability.

2. Description of the Prior Art

Packaging technologies as currently available and the configurations commonly implemented to package the vertical semiconductor devices, e.g., the power MOSFET devices, still face a problem that a leadframe or ceramic substrate is commonly used. There is a thermal mismatch between the metal lines of the leadframe and the printed circuit board (PCB) supporting the electronic device and the leadframe. Due to the thermal mismatch, there is a higher failure rate of solder joints. Furthermore, the conventional mechanical structure has several drawbacks such as the unevenness of the die-lead frame system, the limited die size due to the lead frame limitation, and limitation of stress absorption during board level mounting. Current packaging technologies further has another limitation where there is an assembly acceptance difficulty that often causes higher assembly cost and makes it difficult to replace the conventional high volume packages, such as SO, TO and TSSOP package families to reduce the packaging costs. Such difficulty is caused by the fact that these packages cannot be completely packaged by either a lead frame type packaging technology or a regular surface mount assembly technology. These packages further introduce another difficulty in the board level during the pre-assembly and testing processes due to the operations which are conducted under a sightless condition of the solder joint area between package and PCB. The use of lead frame in these packaging technologies further limits the package to a single die configuration because of the fact that the leadframes do not provide flexibilities to be adaptable to the multiple-chip configuration either as a single module or as an assembly comprised of several modules.

In U.S. Pat. No. 6,133,634 Joshi discloses a semiconductor package as that shown in FIG. 1A. A silicon die 102 is attached to a carrier 106 that has a cavity substantially surrounding the die 102. The cavity dimensions are designed such that the cavity depth is substantially equal to the thickness of die 102 plus the thickness of die attach bond line 104. Direct connection of the active surface of the silicon die to the printed circuit board (PCB) that includes electrical terminals to contact an array of solder bumps distributed across the bottom surface of the die and ball grid array BGA 108 on the bottom edges of the carrier 106 surrounding the die 102. The carrier 106 is formed either as copper or ceramic carrier. Even that this package has the benefits of reducing the package resistance and offers much improved thermal performance, the package has higher production cost due to the requirement to specially manufacture the carrier 106 with specially shaped cavity. Furthermore, due to the geometric shape of the carrier 106, the package as disclosed by Joshi still lacks the flexibility to adapt to different packaging configurations including the multiple-chip module (MCM) configuration.

In another U.S. Pat. No. 6,391,687 entitled "Column Ball Grid Array Package", Cabahug et al. disclose a semiconductor device that includes a flat leadframe that includes a die attach area on a surface of the leadframe. A die including solder bumps is placed thereon and the package further includes a plurality of columns surround at least a portion of the periphery of the die attach area. The die is positioned within the die attach area and the columns have a height substantially equal to the solder bumps and the die on the leadframe as that shown in FIGS. 1B and 1C.

Standing et al. disclose in another U.S. Pat. No. 6,624,522 a chip scale package (CSP) that has a semiconductor MOSFET die which has a top electrode surface covered with a layer of a photosensitive liquid epoxy which is photolithographically patterned to expose portions of the electrode surface and to act as a passivation layer and as a solder mask. A solderable contact layer is then formed over the passivation layer. The individual die are mounted drain side down in a metal clip or can with the drain electrode disposed coplanar with a flange extending from the can bottom.

Granada et al. disclose in another U.S. Pat. No. 6,661,082 a chip device that includes a leadframe that has a die attach cavity. The memory device further includes a die that is placed within the die attach cavity. The die attach cavity is substantially the same thickness as the die. The die is positioned within the cavity and is attached therein with a standard die attachment procedure.

Joshi discloses in another U.S. Pat. No. 6,469,384 a semiconductor device that includes a substrate and a die coupled to the substrate. The MOSFET die is coupled to the substrate such that the source and gate regions of the MOSFET die are coupled to the substrate. Solder balls are provided adjacent to the die such that when the semiconductor device is coupled to a printed circuit board, the exposed surface of the serves as the drain connections while the solder balls serve as the source and gate connections. As shown in FIG. 1D, the substrate includes a base layer 20 and a top, metal layer 21. The base layer and the top metal layer are separated by an insulting layer 22 that may be an insulating epoxy to join the two layers. The base material may comprise a metallized pattern while the top metal layer preferably comprises another metallized pattern. The metal layer may also serve as a heat spreader. However, since the at least one or two layers of this multi-layered substrate is composed of metal, the problem of thermal expansion mismatches between the metal layer and the printed circuit board for supporting the package would still cause thermal stresses. The package is still limited by a reliability problem when operated under thermally challenging environment. Furthermore, the substrate is still manufactured with specially design processes for the purpose of forming the metal layers. The production costs are therefore increased due to the special manufacturing requirements of the package substrate as disclosed in this patented invention.

A stackable three-dimensional multi-chip module (MCM) is disclosed in U.S. Pat. No. 5,222,014. As shown in FIG. 1E, each level of chip carrier in this stackable three-dimensional MCM is interconnected to another level of chip carrier through reflowing of solder balls pre-bumped onto each carrier. Each level of chip carrier, except for the top carrier, has solder balls on both top and bottom surfaces of the substrate.

Optional lids can be used to seal each device, and the lid height would serve as a natural positive stand-off between each level of carriers, giving rise to hour glass shaped solder joints which maximizes the fatigue life of the joints. The packaging configuration disclosed in this patent provides a method to form a three-dimensional stackable module to increase the packing density of the multiple chips. However, it only applies to semiconductor chips where electrical contacts are formed on the same surface.

In U.S. Pat. No. 5,715,144, Ameen et al. disclose another multiple layered multiple chip module configured with a pyramid structure. Multiple tape automatic bonding (ATAB) carriers are used to support chips thereon to stack upon each other in a pyramid configuration and attached to a substrate for reducing the required area on the substrate for mounting components to form a circuit board. However, the ATAB carriers are too thin to maintain its shape, stiffeners need to be used to increase the complexity and package size. Furthermore the disclosed packaging technique is only applicable to package semiconductor chips where all electrical contacts are on the same surface (planar device). Similarly, the stacked packages as disclosed by Akram et al. in U.S. Pat. No. 5,994,166 as shown in FIG. 1F has the same limitations since each individual chip only contacts on one surface of the die.

Therefore, the above patented disclosures do not provide a practical solution to overcome the limitations and difficulties as now encountered by a person of ordinary skill in the art of semiconductor device packaging design and manufactures. Therefore, a need still exists in the art to provide a new and improved configuration and methods to package a vertical semiconductor device such that the above discussed problems and difficulties can be resolved. Furthermore, none of above disclosures can be used for 3D packaging for vertical power MOSFET device and power IC module.

SUMMARY OF THE PRESENT INVENTION

It is therefore an object of the present invention to make it possible to package MOSFET device together with power IC and other passive components like capacitors and resistors into 3D integrated module stack form with the help of an improved configuration for packaging a vertical semiconductor device such as a MOSFET device by forming interconnecting traces in laminated layers. The laminated layers are composed of materials that have similar coefficient of thermal expansion as that of printed circuit board and reduces thermal mismatch problems.

It is another aspect of this invention that the laminated multi-layer carrier such as a PCB or flexible board formed with interconnecting traces improves the yield of packaging processes and produces packages with improved long term reliability. The packaging configuration further provides more flexibly adjustable die size without being limited by specially processed die-attaching carriers formed with special cavity or shapes and sizes with extended edges as that shown above. With commonly available PCB technologies now applied in semiconductor packaging processes, another aspect of this invention is that the configuration disclosed in this invention can be conveniently implemented as a surface mount technology (SMT) package. Because of the flexibility and adaptability of the configuration, the packaging configuration of the present invention can be a convenient replacement of conventional lead frame type packages such as packaging families of SO, TSSOP and TO. Another aspect of this invention is the improvement that the process has improved sight to the solder joint area thus significantly improves the convenience and manufacturability of the packaging processes.

Another aspect of the present invention is to provide an improved configuration for packaging a MOSFET device with available multiple chips packaging on the same layer thus resolve the above-discussed limitations and difficulties of the conventional packaging configurations.

Another aspect of this invention is to provide a configuration that enables a packaging process by stacking dies or packages to two or more layers because the interconnecting traces are now disposed in the laminated layers now are integrated as part of the package. Compared to the packages implemented with leadframes, when implemented with the packaging configuration as disclosed in this invention, the arrangements and interconnections between the integrated circuit (IC) chips have much greater degrees of freedom. Exemplary embodiments may include multiple-chip modules are configured as all sources and gates are arranged to face down or all drains are arranged to face down or combinations of some drains facing down while some sources and gates are configured to face down.

Briefly in a preferred embodiment this invention discloses an electronic package for containing at least a top packaging module vertically stacked on a bottom packaging module. Each of the packaging modules includes a semiconductor chip packaged and connected by via connectors and connectors disposed on a laminated board fabricated with a standard printed-circuit board process wherein the top and bottom packaging module further configured as a surface mountable modules for conveniently stacking and mounting to prearranged electrical contacts without using a leadframe. In a preferred embodiment, at least one of the top and bottom packaging modules is a multi-chip module (MCM) containing at least two semiconductor chips. At least one of the top and bottom packaging modules includes a ball grid array (BGA) for surface mounting onto the prearranged electrical contacts. At least one of the top and bottom packaging modules includes a plurality of solder bumps on one of the semiconductor chips for surface mounting onto the prearranged electrical contacts. The laminated board of the bottom packaging modules further has a thermal expansion coefficient substantially the same as a printed circuit board (PCB) whereby a surface mount onto the PCB is less impacted by a temperature change.

This invention further discloses a method for configuring an electronic package for containing at least a top packaging module vertically stacked on a bottom packaging module. The method includes a step of fabricating a multi-layered laminated board with a standard printed-circuit board process for providing via connectors and connecting traces for packaging a semiconductor in each of the top and bottom packaging modules. The method further includes a step of fabricating and configuring the top and bottom packaging module as a surface mountable modules for conveniently stacking and mounting to prearranged electrical contacts without using a leadframe. In a preferred embodiment, the method further includes a step of fabricating and configuring at least one of the top and bottom packaging module as a multi-chip module (MCM) containing at least two semiconductor chips. In another preferred embodiment, the method further includes a step of fabricating and configuring a ball grid array (BGA) on a bottom surface of at least one of the top and bottom packaging modules for surface mounting onto the prearranged electrical contacts. In another preferred embodiment, the method further includes a step of fabricating and configuring a solder bump array on a bottom surface of at least one of the top and bottom packaging modules for surface mounting onto the prearranged electrical contacts.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
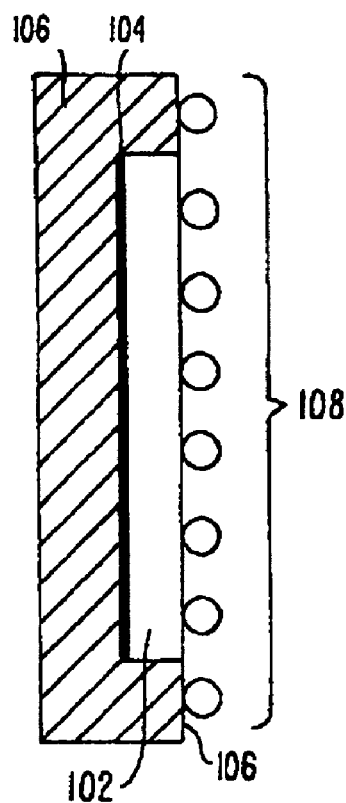
FIGS. 1A to 1F are cross sectional views and perspective views for showing the conventional packaging configurations.
Figure 1B:
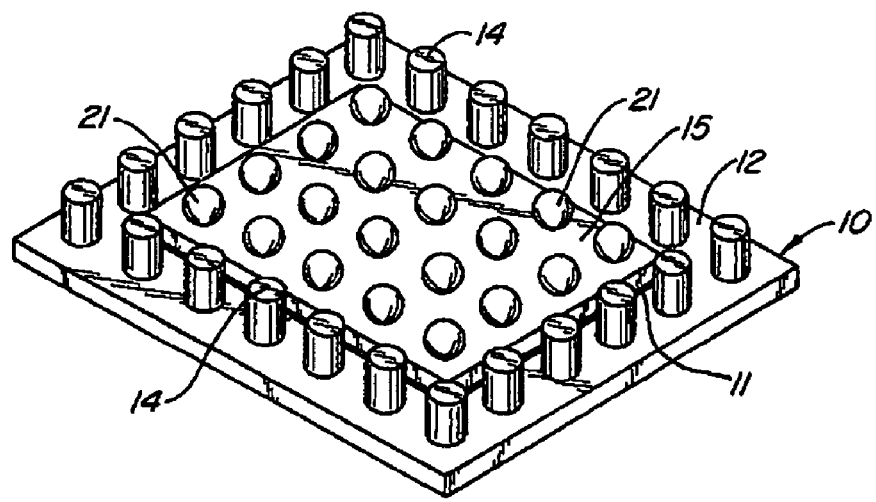
Figure 1C:
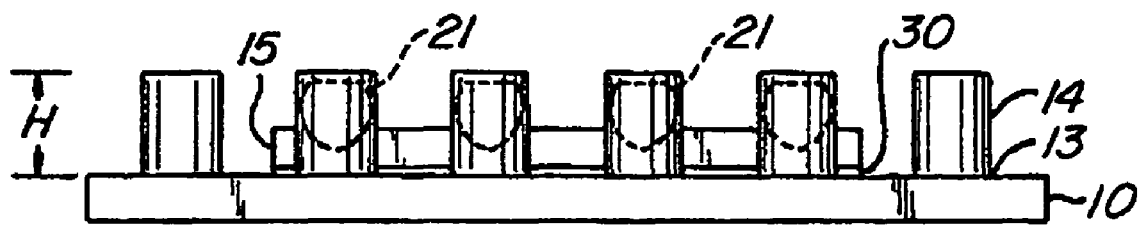
Figure 1D:
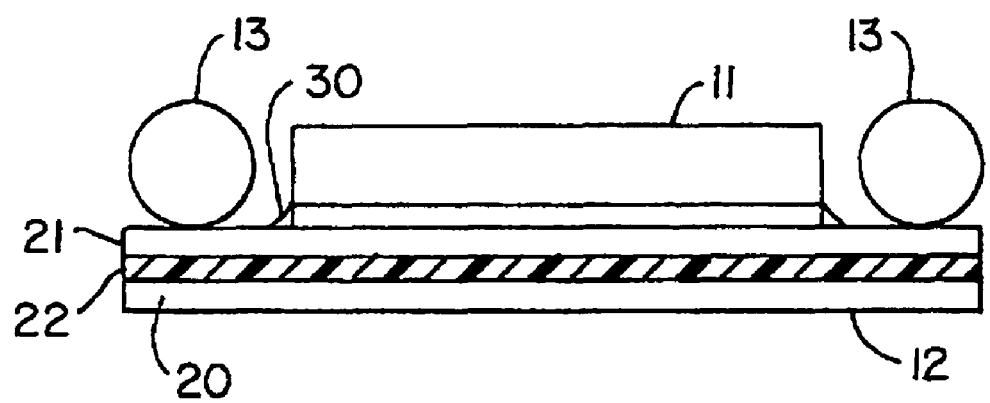
Figure 1E:
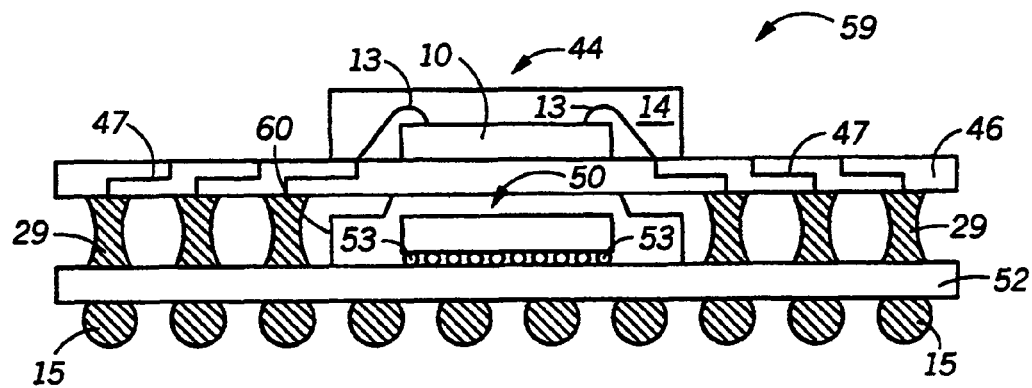
Figure 1F:
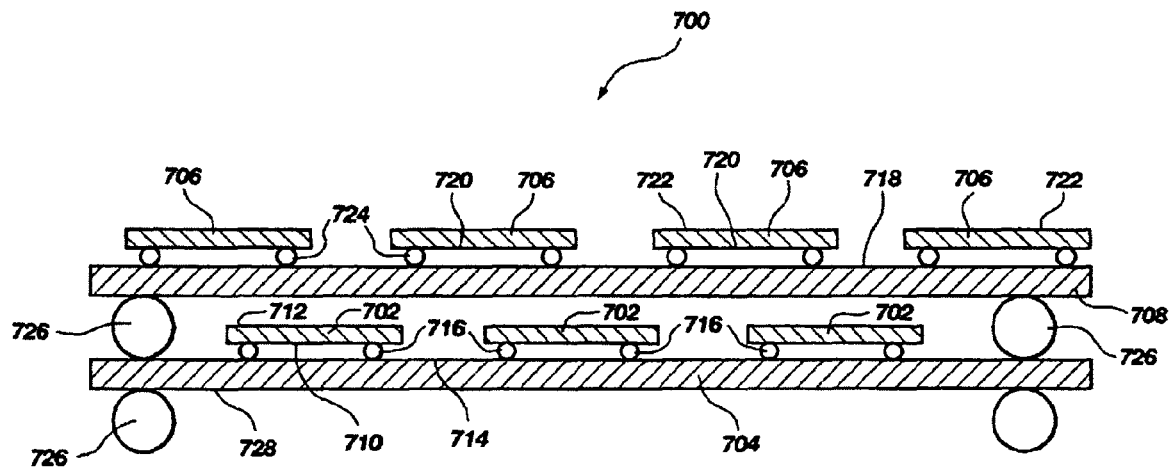
Figure 2A:
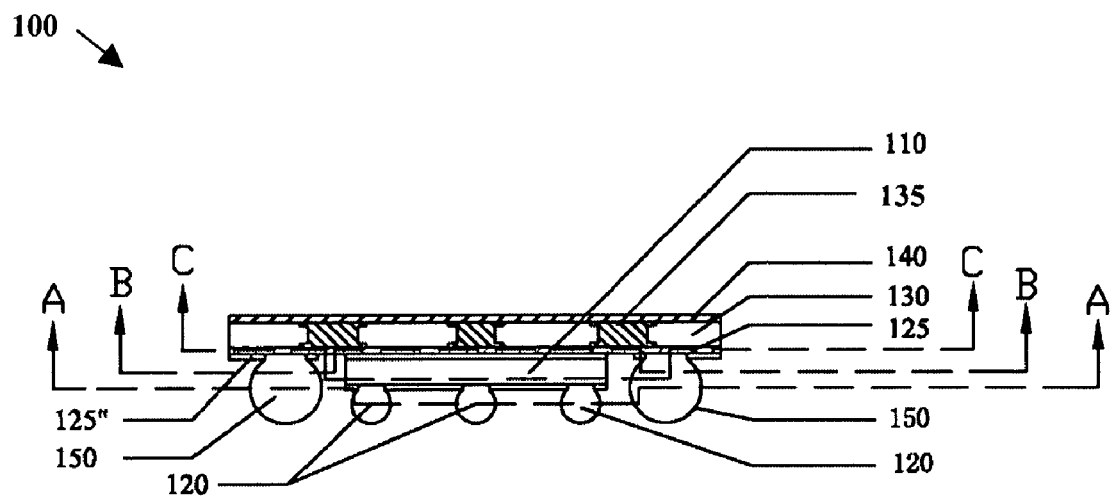
FIGS. 2A to 2D are side cross sectional view and top and bottom view of an improved packaging configuration of a MOSFET device of this invention.
Figure 2B:
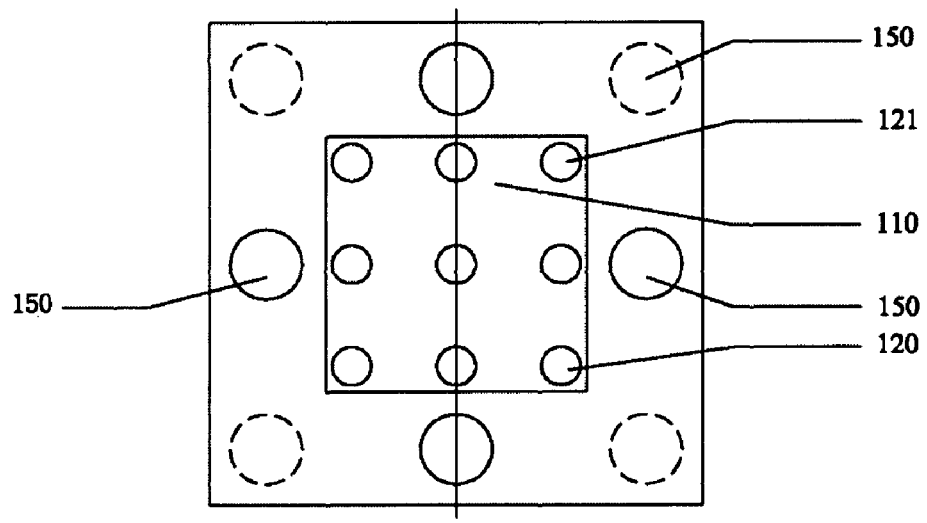

Referring to FIGS. 2A and 2B for a side cross sectional view and a bottom view of a new MOSFET package 100 of this invention. The MOSFET package 100 includes a MOSFET semiconductor chip 110 that has a plurality of solder bumps 120 and 121. The solder bumps 120 and 121 are in electrical contact to the source pad and gate pad disposed on the top surface of the MOSFET chip 110. A plurality of copper traces 125 is connected to the drain contact disposed on the bottom surface of the MOSFET chip 110. A copper plate 125' is electroplated to a laminated board, e.g., a printed circuit board (PCB) 130, that has a plurality of via connector filled with copper 135 therein to connect to the top surface. A top copper plate 140 is further electroplated to the top surface of the laminated board, e.g., the PCB 130. A ball grid array (BGA) that includes a plurality of solder balls 150 is disposed on the bottom surface of the PCB 130. The balls 150 of the BGA are in electric contact with the copper trace 125 through the holes of solder mask 125".

Figure 2C:
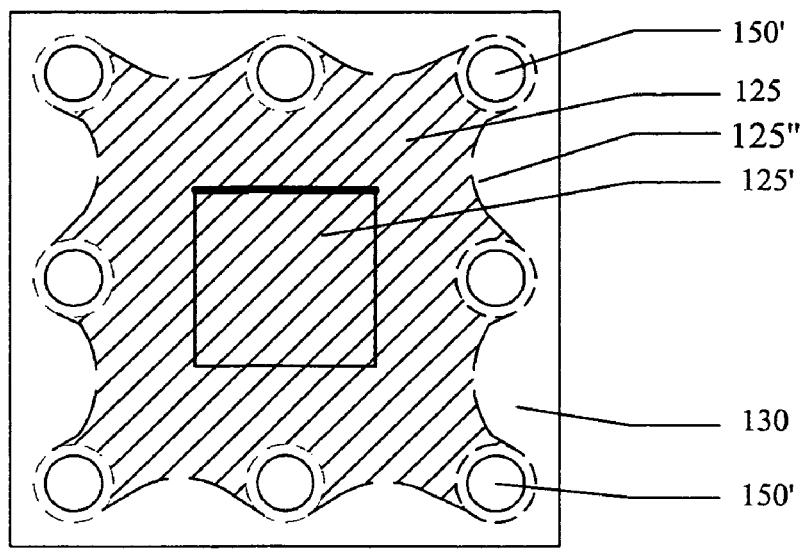
Figure 2D:
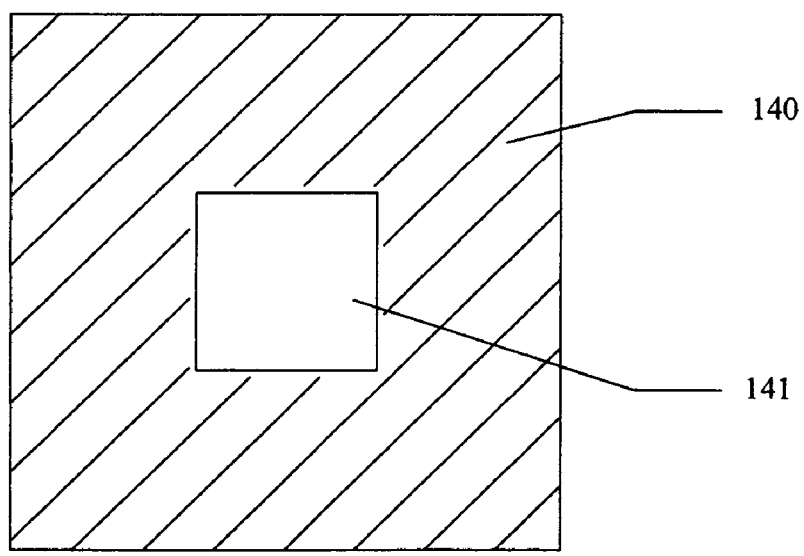

Referring to FIGS. 2C and 2D for a bottom view at the bottom of the PCB 130 along the line A-A as that shown in FIG. 2A. The bottom surface of the PCB 130 has a copper plate 125' electroplated to the bottom surface of the PCB 130 to attach the drain of the MOSFET 110 to the copper plate 125'. The remainder of the areas of the bottom surface of the PCB 130 is covered by a solder mask 125" to form the cooper traces 125 that extends from the copper plate 125' to the BGA pads 150' for soldering the BGA balls 150 thereon. The BGA pads 150's is further electrically connected to the via connector 135 with copper filled in the via openings formed in the PCB board 130. Referring to FIG. 2D for a top view of the package that has a copper layer 140 with the center portion etched off. The etch off area 141 is optional and can be used for laser marking or other purpose.

Figure 3A:
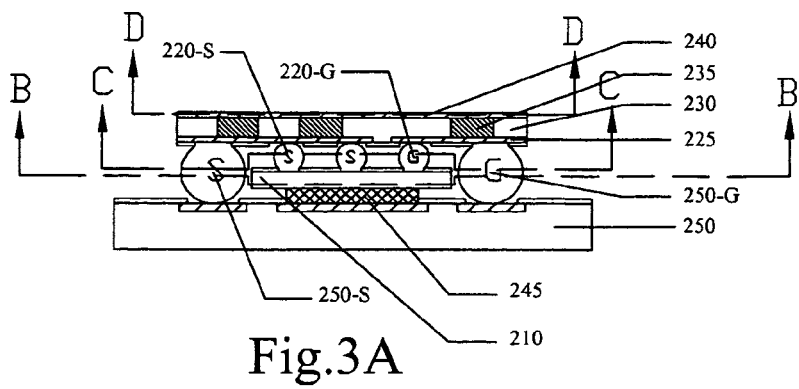
FIGS. 3A to 3D are side cross sectional view and top and bottom view of another improved packaging configuration of a MOSFET device of this invention.
Figure 3B:
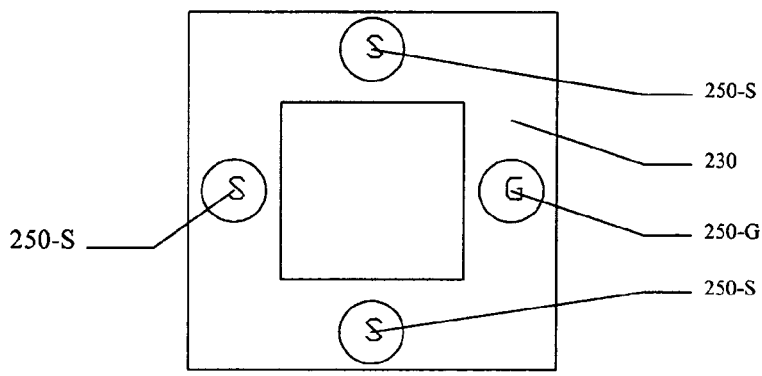

Referring to FIGS. 3A and 3B for a side cross sectional view and a bottom view of a new MOSFET package 200 of this invention. The MOSFET package 200 includes a MOSFET semiconductor chip 210 is packaged as a flip chip with a configuration where a plurality of solder bumps 220 are attached to solder pads formed on the bottom surface of a laminated multi-layer substrate carrier, e.g., a PCB board carrier 230. The solder bumps 220-G are in electrical contact to the gate pad 225-GP that is soldered to a gate solder ball 250-G. The solder bumps 220-S are in electrical contact to the source pads 225-SP with each source pad 225-SP soldered to a source solder ball 250-S. A drain contact 245 is formed on the bottom surface of the MOSFET chip 210 with the bottom surface of the drain contact 245 aligned to have about a same elevation as the gate and source solder balls 250-G and 250-S respectively. The package 200 is therefore ready for further implementation as a SMT (surface mount technology) package commonly supported by a PCB carrier 250 to connect to other electronic devices (not shown) supported on the PCB carrier 250 as a multiple-chip module (MCM). Since the laminated multiple-layered substrate carrier 230 has about the same thermal expansion coefficient as the PCB carrier, the package 200 has much improved solder joint reliability.

Figure 3C:
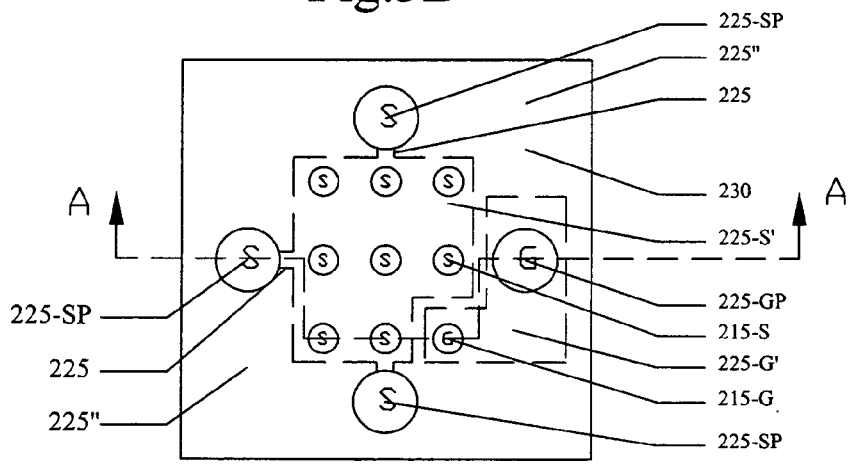
Figure 3D:
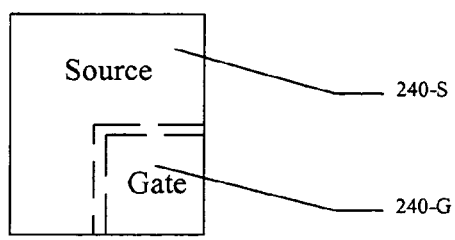

Referring to FIG. 3C for a bottom view at the bottom of the PCB 230 along the line C-C as that shown in FIG. 3A. The bottom surface of the PCB 230 has a solder mask 225" with solder bump openings 215-S and 215-G exposing the underlying copper layer electroplated to the bottom surface of the PCB 230 to attach the solder bumps 220-G and 220-S of the MOSFET 210 to the copper plate 225-S' and 225-G'. The remainder of the areas of the bottom surface of the PCB 230 is covered by a solder mask 225" to insulate the copper traces 225 that extends from the copper plate 225-G' and 225-S' to the BGA gate pad 225-GPand the BGA source pads 225-SP for soldering the BGA gate ball 250G and source balls 250S thereon. The BGA balls 250's is further electrically connected to the via connector 235 with copper filled in the via openings formed in the PCB board 230. Referring to FIG. 3D for a top view of the package that has a copper layer 240S and 240G formed on the top of the package as source and gate contact pads for external connections.

Figure 4A:
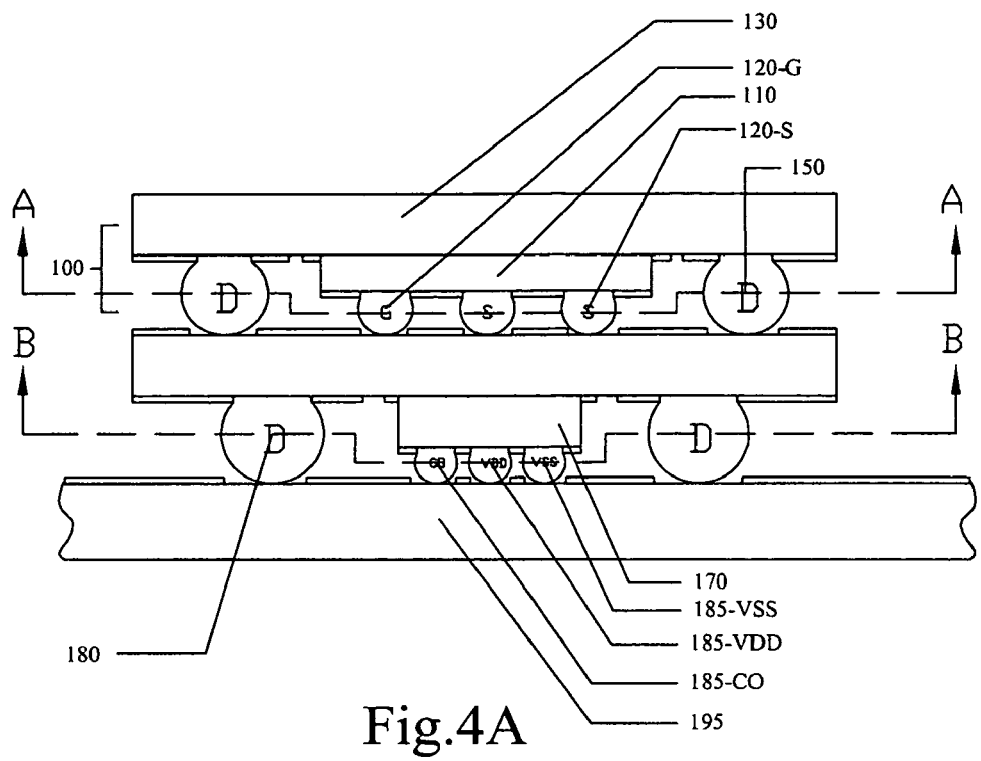
FIGS. 4A to 4C are respectively a side cross sectional view and a top view of a cross section along A-A and B-B sections shown in FIG. 4A for showing a three dimensional stacked MOSFET and power IC module (3DSM) of this invention.
Figure 4B:
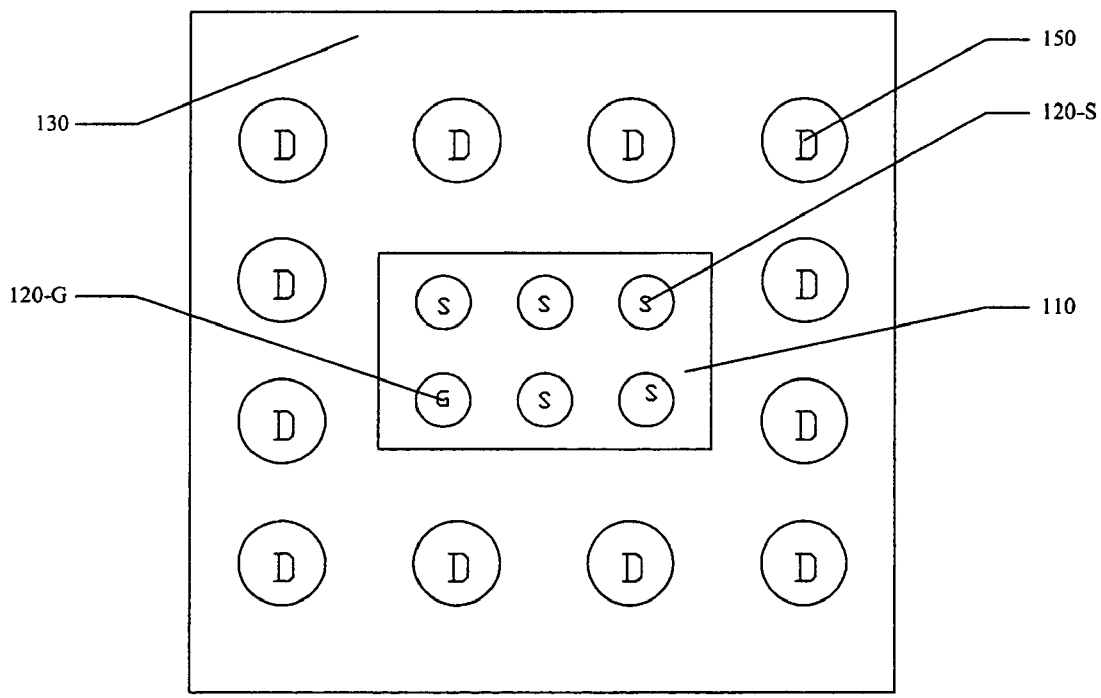
Figure 4C:
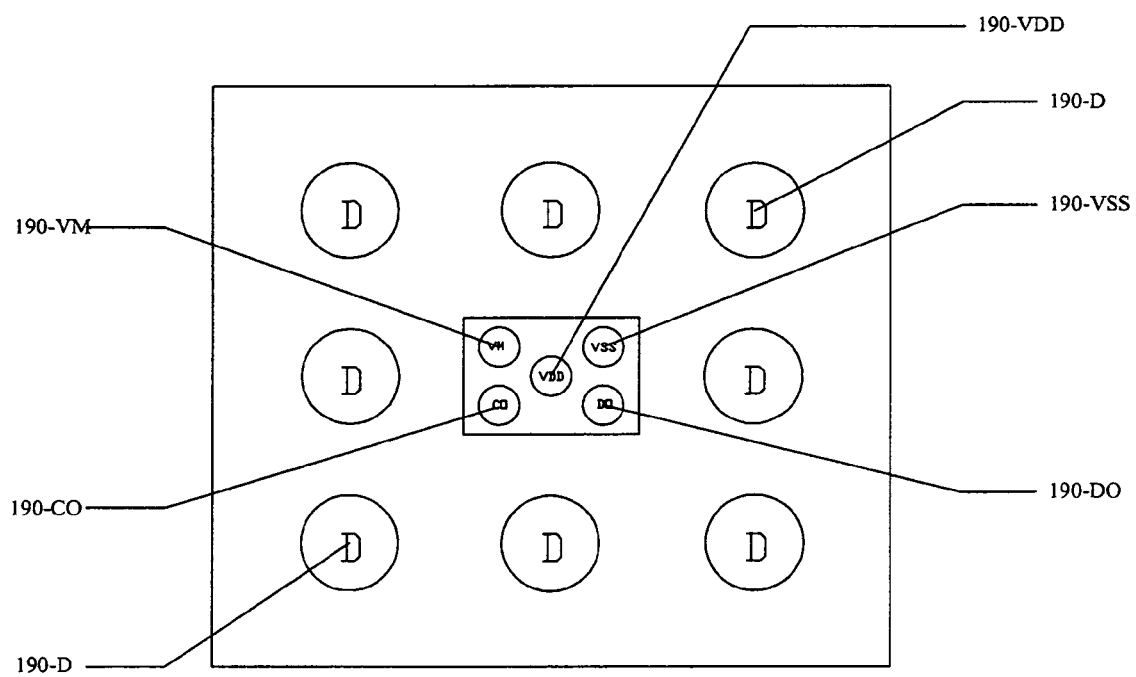

Referring to FIGS. 4A to 4C for a three-dimensional stack MOSFET and power IC module of this invention. FIG. 4A shows a cross sectional view of a three-dimensional stacked module (3DSM) wherein the top module is constructed as a MOSFET module 100 similar to that shown in FIGS. 2A to 2D. FIG. 4B show a bottom view of a cross sectional area across A-A in FIG. 4A. Specifically, the MOSFET module 100 includes a MOSFET semiconductor chip 110 that has a plurality of solder bumps 120 to function as source bumps 120-G, and gate bump 120-G. The solder bumps 120-G and 120-S are in electrical contact to the gate pad and source padrespectfully disposed on the top surface of the MOSFET chip 110. A plurality of copper traces 125 is connected to the drain contact disposed on the bottom surface of the MOSFET chip 110. A printed circuit board (PCB) 130 that has a plurality of via connector filled with copper therein as shown in FIG. 2A. A top copper plate may be further electroplated to the top surface of the laminated board, e.g., the PCB 130. A ball grid array (BGA) that includes a plurality of solder balls 150 is disposed on the bottom surface of the PCB 130. The balls 150 of the BGA may be in electric contact with the via-connectors as that shown in FIG. 2A.

MOSFET module 100 is stack upon a second module supported on a second laminated multiple layered PCB board 160. The second PCB board 160 provides inter-layer connections and also inter-layer via connection (not explicitly shown for the sake for brevity). The inter-layered via connections provide electrical connections between the solder balls 150 to solder balls 180 disposed below the bottom surface of the second laminated board 160. The solder balls 180 are connected to the drain of the semiconductor power device 110 usually serve the function for connecting to a power supply voltage. The second module further includes a second integrate circuit chip 170 that may be a controller chip or can also be a power chip depending on the specific application usually dictated by a client that purchases this three-dimensional module for particular applications. The integrated three-dimensional module is configured as a surface mount module including solder balls 180 and solder bumps, e.g., 185-co, 185-vdd, 185-do, 185-vss, 185-vm, etc., attaching onto contact pads 190-D, 190-vdd, 190-do, 190-vss, 190-vm, etc. as that shown in FIG. 4C. Where Vdd is a power voltage, Vss is a ground voltage and Vco, Vdo, and Vmm are signal voltages. These solder balls and bumps are connected to different circuit supported on a laminated board, e.g., a PC board 195. The specific connections and the configuration of the PC board 195 is defined by applications dictated by a client who orders the three dimensional power chip module configured as stack modules of a MOSFET module on top of a control IC chip module shown in FIGS. 4A to 4C.

Figure 5A:
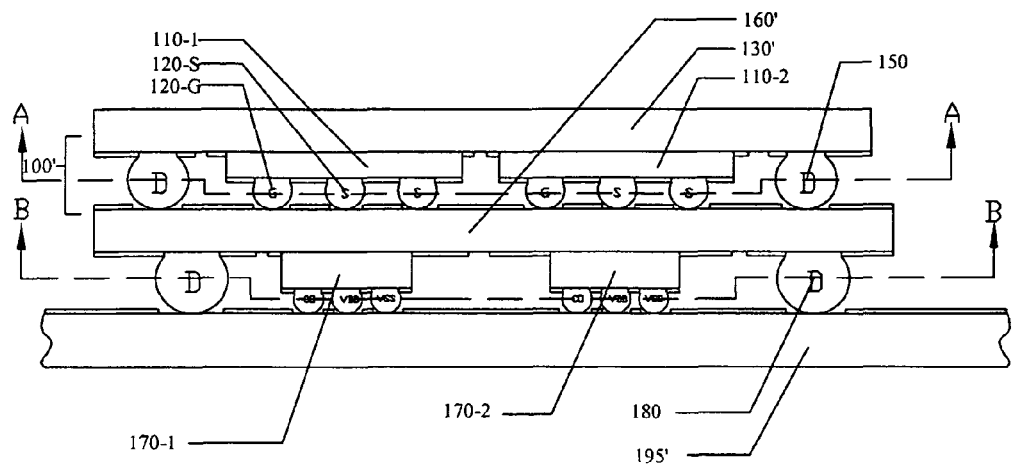
FIGS. 5A to 5C are respectively a side cross sectional view and a top view of a cross section along A-A and B-B sections shown in FIG. 5A for showing a three dimensional stacked MOSFET and power IC multiple-chip module (3DSMCM) of this invention.
Figure 5B:
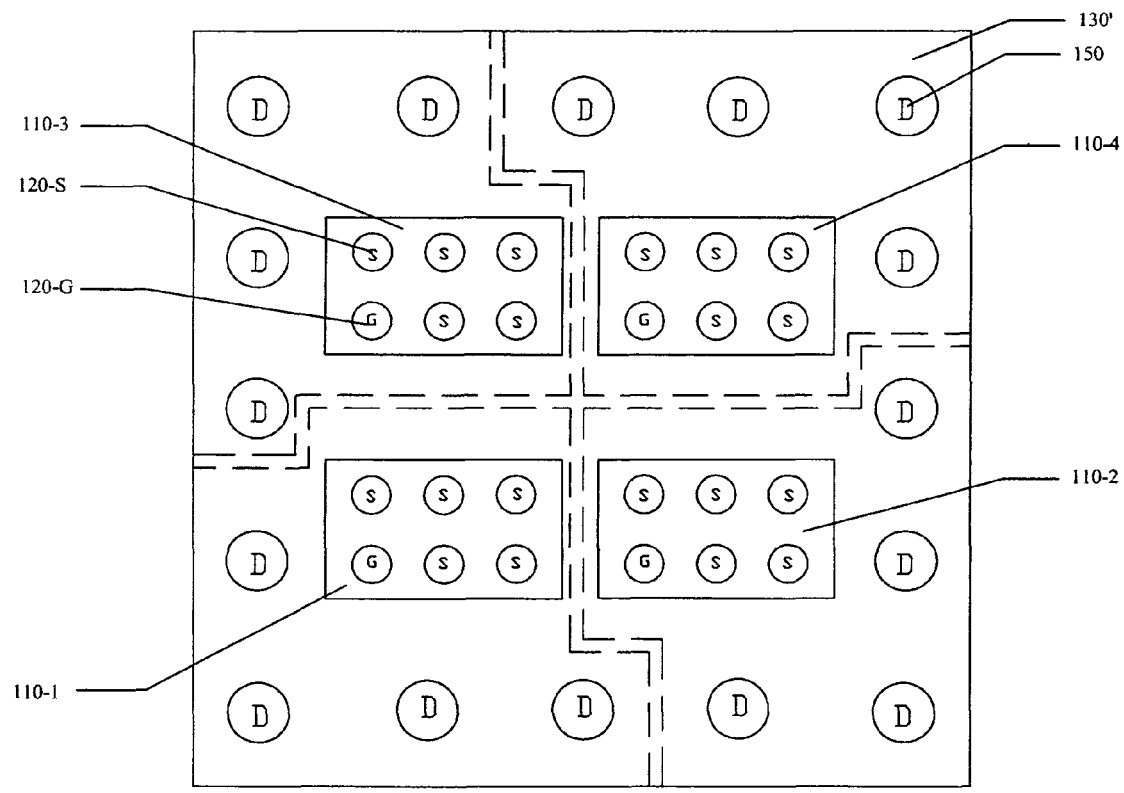
Figure 5C:
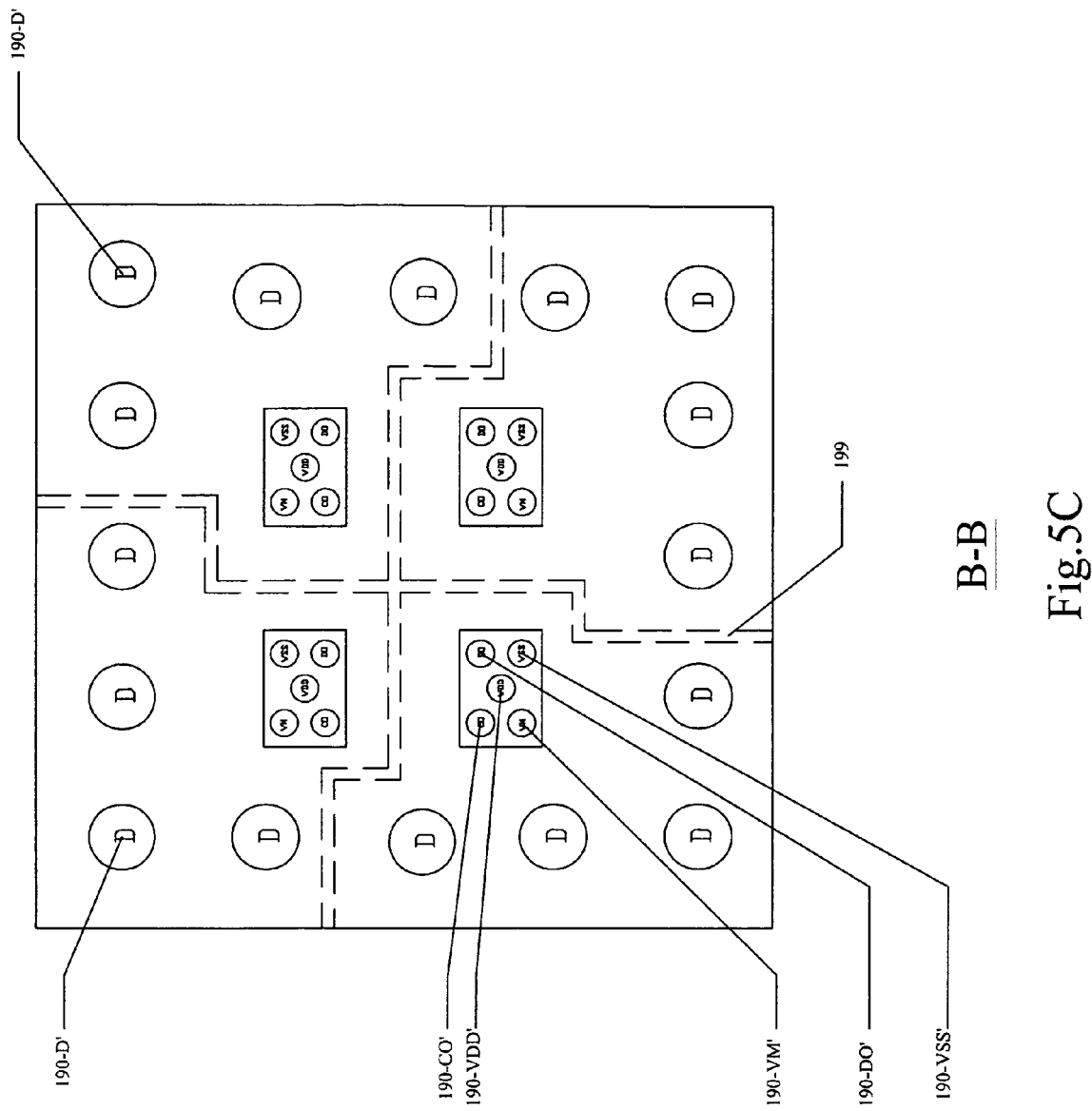

Referring to FIGS. 5A to 5C for a three-dimensional MOSFET and power IC multiple-chip module (3DMCM) configured with stacked multiple chip modules. Each level of multiple chip module (MCM) is packaged with laminated board that has similar configuration as that shown in FIGS. 2A and 2B. In a preferred embodiment shown in FIG. 5A, four MOSFET chips 110-1 to 110-4 are packaged as a top level MCM module 100'. Each MOSFET is packaged with the laminated board 130' with an substantially similar configuration shown in FIGS. 2A and 2B with a cross sectional view along the line A-A shown in FIG. 5B where separation and insulation line are disposed on the bottom surface of the top laminated board 130' to separate and insulated a MOSFET chip 110-1 to 110-4 from each other. The top level MCM module is then surface mounted onto a second level laminate board 160' served a similar connection and supporting functions as that shown in FIG. 4A. Multiple inter-layered via connections through the laminated board 160' (not shown) are connecting the ball grid array 150 to a common drain to the bottom BGA array 180 for providing a power supply voltage for the MOSFET chips. The two level stacked MCM module then mounted onto a bottom laminated board 195' with specific connections and configurations defined by a client. As shown in FIG. 5C, four controller IC chips or power chips 170-1 to 1704 are packaged with the laminated board 160' wherein each chip includes solder bumps to serve as contact to contact pads 190-co', 190-vm', 190-vss', 190-vdd', 190-do' and other contact pads if necessary for specific applications defined by the clients disposed on the bottom laminated board 195'.

According to above descriptions, this invention disclose configurations and method to package vertical power MOSFET and IC devices by using standard surface mount (SMT) assembly processes that do not require lead frames. Because the straightforward SMT processes, it is not necessary to use the lead-frame related packaging processes and equipment. The configurations as disclosed also combine the component level BGA process, e.g., the BGA arrays 150 and 180, with the chip level solder bumping processes, e.g., the solder bumps 120-G, 120-S, such that more flexibly arranged packaging configurations can be easily accomplished. Multiple level of polymer based laminated boards such as boards 130 and 160 are employed. The laminated board technologies for providing interconnections, copper traces, solder mask opening and large exposed metal areas in either sides of the board are well known and well practiced. Such packaging configurations minimize the risks involved in employing new and unknown technologies and also reduce the packaging costs. The configurations as presented in FIGS. 4 and 5 provide a platform to make it feasible and cost effective to stack multiple chips onto an integrated laminated BGA package with surface mounted process without requiring leadframes. The packaging configurations can be applied for individual power IC, MOSFET devices and all other kinds of semiconductor IC devices, or combinations of mixing these power IC, MOSFET devices and other kinds of semiconductor IC devices.

As shown above, the MOSFET chips can be packaged by attaching the drain of a bumped MOSFET chips to the laminated board. Alternately, the MOSFET chips can be packaged by using a flip chip configuration with the bumped MOSFET chips attaching to the metal exposed through solder masks openings using conductive adhesive agents or solder paste. The solder balls are attached to metal through the solder mask openings of the laminated board. And the wafer bumps are attached to the metal traces formed also on a laminated board. In addition to the advantage that by applying simplified surface mount technologies, the modules can be conveniently stacked, these kinds of attachment further provide another advantage because of good thermal dissipation and short interconnecting path are achieved. The parasitic inductance and resistance are therefore reduced. The three dimensional modules as disclosed further achieve more compact packages with flexible structures thus suitable for packaging IC chips with larger die sizes than that is achievable by leadframe based packages. Additionally, since the laminated boards including the processes on the PCB boards are well understood and can be conveniently processed, the package assemblies as disclosed can be produced with much lower price in shorter time to tool up the production lines. Compared to the leadframe-based packages or flip-chip packages, production costs are reduced because of improved cost structures involved in different phases of the production processes. The laminated PCB boards further provide additional advantages that copper traces and via connections can be conveniently formed with sufficient flexibilities for connecting to the MOSFET chips and power IC to accommodate different types of application requirements. With the high temperature MOSFET and power IC now stackable in one integrated module, a system in package (SIP) or system in module (SIM) can be achieved for broad applications. These applications may include but not limited to power management, board level packaging, etc.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. An electronic package for containing at least a top packaging module vertically stacked on a bottom-packaging module for packaging at least a top integrated circuit (IC) chip and a bottom IC chip therein respectively,: the electronic package further comprising:

a top and a bottom laminated boards each having via connectors and conductive traces distributed on multiple layers of said laminated boards and connected to selected via connectors and each of said laminated boards having a patterned metal plates covering over an extensive area of a bottom surface of said laminated board;

each of said top and bottom IC chips having a flat-surface electrode and each of said flat-surface electrodes is face-to-face soldered to the metal plates disposed on the bottom surface of said laminated boards and said bottom laminated board further having a top surface having electrical contact pads matched with electrode footprints of said top packaging module to surface mount said top packaging module directly onto said bottom laminated board; and said top packaging module further comprising a first ball grid array (BGA) including a first set of top-tall solder balls connected to said flat surface electrode of said top IC chip through the solder mask disposed on said bottom surface of said upper laminated board wherein said top-tall solder balls are extended downwardly from said bottom surface of said upper laminated board to contact the electrical contact pads disposed on said top surface of said lower laminated board to stack vertically thereon, and wherein said bottom IC chip of said bottom packaging module further includes solder bumps extended from electrodes of said bottom IC chip contained in said bottom packaging module wherein said solder bumps extended downwardly to substantially a same horizontal plane as said second set of top-ball solder balls of a second BGA for conveniently mounting directly onto terminals disposed on a print circuit board (PCB).

2. The electronic package of claim 1 further wherein:
said bottom packaging module further includes a second ball grid array (BGA) comprising a second set of top-tall solder balls connected to said flat surface electrode of said bottom IC chip through the solder mask disposed on the bottom surface of said lower laminated board wherein said second set of top-tall solder balls extending downwardly from the bottom surface of said lower laminated board for mounting on electrical terminals disposed on a printed circuit board (PCB) wherein said bottom packaging module is surface mounted onto the printed circuit board (PCB).

3. The electronic package of claim 1 wherein:
said top IC chip of said top packaging module further includes solder bumps connected to and extended from electrodes of said top IC chip contained in said top packaging module wherein said solder bumps extended downwardly to substantially a same horizontal plane as said first set of top-tall solder balls as said first BGA for conveniently mounting directly onto said electrical contact pads disposed on the top surface of the lower laminated board matched with the electrode footprints of said top packaging module.

4. The electronic package of claim 1 wherein:
said top packaging module further comprising a MOSFET chip with the first ball grid array (BGA) including the first set of top-tall solder balls connected to a drain electrode of said MOSFET chip as said flat surface electrode of said top IC chip through the solder mask disposed on said bottom surface of said upper laminated board.

5. The electronic package of claim 1 wherein:
said bottom packaging module further includes a second ball grid array (BGA) comprising a second set of top-tall solder balls connected to said flat surface electrode of said bottom IC chip through the solder mask disposed on the bottom surface of said lower laminated board wherein said second set of top-tall solder balls extending downwardly from the bottom surface of said lower laminated board for surface mounting onto electrical terminals disposed on a printed circuit board (PCB); and said second set of top-tall solder balls of the bottom packaging module are electrically connected to said first set of top-tall solder balls of the top packaging module through via connectors in said lower laminated board.

6. The electronic package of claim 2 wherein:
said bottom packaging module further includes a MOSFET chip with the second ball grid array (BGA) comprising the second set of top-tall solder balls connected to a drain electrode as said flat surface electrode of said MOSFET chip through the solder mask disposed on the bottom surface of said lower laminated board.

7. The electronic package of claim 3 wherein:
said bottom IC chip of said bottom packaging module further includes solder bumps extended from electrodes of said bottom IC chip contained in said bottom packaging module wherein said solder bumps extended downwardly to substantially a same horizontal plane as said second set of top-tall solder balls of said second BGA for conveniently mounting directly onto terminals disposed on said print circuit board (PCB).

8. The electronic package of claim 7 wherein:
said second set of top-tall solder balls of the bottom packaging module are electrically connected to said first set of top-tall solder balls of the top packaging module through via connectors in said lower laminated board.

9. The electronic package of claim 7 wherein:
at least one of the top-tall solder balls of said second BGA is connected to a power supply voltage.

10. The electronic package of claim 7 wherein:
one of the solder bumps of said bottom packaging module is connected to a Vco signal voltage.

11. The electronic package of claim 7 wherein:
one of the solder bumps of said bottom packaging module is connected to a Vdd power voltage.

12. The electronic package of claim 7 wherein:
one of the solder bumps of said bottom packaging module is connected to a Vdo signal voltage.

13. The electronic package of claim 7 wherein:
one of the solder bumps of said bottom packaging module is connected to a Vss ground voltage.

14. The electronic package of claim 7 wherein:
one of the solder bumps of said bottom packaging module is connected to a Vmm signal voltage.

15. An electronic package for containing at least a top packaging module vertically stacked on a bottom-packaging module for packaging at least a top integrated circuit (IC) chip and a bottom IC chip therein respectively,: the electronic package further comprising:

a top and a bottom laminated boards each having via connectors and conductive traces distributed on multiple layers of said laminated boards and connected to selected via connectors and each of said laminated boards having a patterned metal plates functioning as a solder mask covering over an extensive area of a bottom surface of said laminated board;

each of said top and bottom IC chips having a flat-surface electrode and each of said flat-surface electrodes is face-to-face soldered to the metal plates functioning as the solder mask disposed on the bottom surface of said laminated boards and said bottom laminated board further having a top surface having electrical contact pads matched with electrode footprints of said top packaging module to surface mount said top packaging module directly onto said bottom laminated board; and at least one of said top and bottom IC chips contained in said top and said bottom packaging modules comprising a vertical metal oxide semiconductor field effect transistor (MOSFET) chip having a drain electrode configured as the flat-surface electrode and face-to-face soldered to one of the metal plates functioning as the solder mask.

16. The electronic package of claim 15 wherein:

said top IC chip comprises said vertical MOSFET chip contained in said top packaging module further includes solder bumps extended from said electrodes disposed on said bottom surface of said MOSFET chip contained in said top packaging module and extended to substantially a horizontal plane-for mounting onto electrical contact pads disposed on the top surface of said lower laminated board.

17. The electronic package of claim 15 wherein:

said bottom IC chip comprises a bottom MOSFET chip contained in said bottom packaging module further includes solder bumps extended from said electrodes disposed on a bottom surface of said bottom MOSFET chip contained in said bottom packaging module and extending downwardly to substantially a same horizontal plane as said second set of tall solder balls of said second BGA for conveniently mounting onto said electrodes disposed on said print circuit board.

18. The electronic package of claim 16 wherein:

said top IC chip comprises the vertical MOSFET chip contained in said top packaging module further includes the solder bumps electrically connected to source and gate contacts of said top MOSFET chip.

19. The electronic package of claim 17 wherein:

said bottom IC chip comprises the bottom MOSFET chip contained in said bottom packaging module further includes the solder bumps electrically connected to source and gate contacts of said bottom MOSFET chip.

20. An electronic package for containing at least a top packaging module vertically stacked on a bottom packaging module for packaging at least a top integrated circuit (IC) chip and a bottom IC chip therein respectively, the electronic package further comprising:

a top and a bottom laminated boards each having via connectors and conductive traces distributed on multiple layers of said laminated boards and connected to selected via connectors and each of said laminated boards having a patterned metal plates functioning as a solder mask covering over an extensive area of a bottom surface of said laminated board; and each said top and bottom IC chips comprises a MOSFET chip having a drain configured as a flat-surface electrode and each of said flat-surface electrodes is face-to-face soldered to the metal plates functioning as the solder mask disposed on the a bottom surface of said laminated boards and said bottom laminated board further having a top surface having electrical contact pads matched with electrode footprints of said top packaging module to surface mount said top packaging module directly onto said bottom laminated board.

21. The electronic package of claim 20 wherein:

said top packaging module further comprising a first ball grid array (BGA) including a first set of top-tall solder balls connected to said drain of the MOSFET chip of the top packaging module through the solder mask disposed on said bottom surface of said upper laminated board wherein said top-tall solder balls are extended downwardly from said bottom surface of said upper laminated board to contact the electrical contact pads disposed on said top surface of said lower laminated board to stack vertically thereon; and said bottom packaging module further includes a second ball grid array (BGA) comprising a second set of top-tall solder balls connected to said drain of said MOSFET chip of the bottom packaging module through the solder mask disposed on the bottom surface of said lower laminated board wherein said second set of top-tall solder balls extending downwardly from the bottom surface of said lower laminated board for mounting on electrical terminals disposed on a printed circuit board (PCB)-wherein said bottom packaging module is surface mounted onto the printed circuit board (PCB).

22. The electronic package of claim 20 wherein:

said lower laminated board of said bottom packaging module further having a thermal expansion coefficient substantially the same as a printed circuit board (PCB) disposed below and supports said bottom packaging module functioning as a carrier substrate whereby a surface mount onto said PCB is less impacted by a temperature change.

23. The electronic package of claim 21 wherein:

said second set of top-tall solder balls of the bottom packaging module are electrically connected to said first set of top-tall solder balls of the top packaging module through via connectors in said lower laminated board.

* * * * *